(12) United States Patent
Brottier et al.

(10) Patent No.: US 9,236,515 B2
(45) Date of Patent: Jan. 12, 2016

(54) HYBRID SOLAR PANEL

(75) Inventors: Laetitia Brottier, Marseilles (FR); Jerome Mouterde, Marseilles (FR)

(73) Assignee: SOLAIRE 2G, Rousset (FR)

(*) Notice: Subject to any disclaimer, the term of this patent is extended or adjusted under 35 U.S.C. 154(b) by 19 days.

(21) Appl. No.: 13/988,758

(22) PCT Filed: Nov. 21, 2011

(86) PCT No.: PCT/FR2011/052718
§ 371 (c)(1),
(2), (4) Date: Sep. 13, 2013

(87) PCT Pub. No.: WO2012/069750
PCT Pub. Date: May 31, 2012

(65) Prior Publication Data
US 2014/0007919 A1    Jan. 9, 2014

(30) Foreign Application Priority Data
Nov. 22, 2010   (FR) ...................................... 10 59597

(51) Int. Cl.
*H01L 31/042*     (2014.01)
*H01L 31/052*     (2014.01)
*H02S 40/44*      (2014.01)

(52) U.S. Cl.
CPC ............ *H01L 31/0521* (2013.01); *H02S 40/44* (2014.12); *Y02E 10/60* (2013.01)

(58) Field of Classification Search
CPC . H01L 31/052; H01L 31/0521; H01L 31/058; H02S 40/44
USPC ................................................. 136/246, 248
See application file for complete search history.

(56) References Cited

U.S. PATENT DOCUMENTS

| 4,019,494 | A | * | 4/1977  | Safdari .......................... 126/658 |
| 4,184,543 | A |   | 1/1980  | Kleine et al. |
| 4,361,717 | A |   | 11/1982 | Gilmore et al. |
| 5,553,377 | A | * | 9/1996  | Hirano et al. ............ 29/890.053 |

(Continued)

FOREIGN PATENT DOCUMENTS

| DE | 36 11 543    A1 | 10/1987 |
| DE | 19747325        | 4/1999  |
| DE | 103 44 084   A1 | 5/2005  |
| DE | 102004002900    | 8/2005  |
| EP | 0 460 872       | 12/1991 |

(Continued)

*Primary Examiner* — Eli Mekhlin
(74) *Attorney, Agent, or Firm* — Pearl Cohen Zedek Latzer Baratz LLP

(57) ABSTRACT

The invention relates to a hybrid solar panel comprising: photovoltaic elements (1) having a front face and a rear face; a heat exchanger (E) arranged opposite the rear face of said photovoltaic elements (1); and a cooling fluid circulating in said exchanger (E) in such a way as to cool the photovoltaic elements (1), said exchanger (E) comprising a heat exchange region (ZE) through which said fluid flows, arranged beneath said photovoltaic elements (1), said exchange region comprising elements (20) that enable the flow of the fluid to be disrupted in such a way as to stimulate the heat exchanges in the exchange region (ZE). The invention is characterized in that said exchange region (ZE) is formed by a lower exchange plate (2) designed in such a way as to form built-in obstruction elements (20) extending over the entire thickness of the strand of cooling fluid flowing through the exchange region, and in that the upper end of the obstruction elements (20) is in contact with the rear face of the photovoltaic elements (1) in such a way that said photovoltaic elements are cooled mainly at these contact points.

7 Claims, 5 Drawing Sheets

(56) References Cited

U.S. PATENT DOCUMENTS

| | | | |
|---|---|---|---|
| 5,935,343 A | 8/1999 | Hollick | |
| 6,201,179 B1 | 3/2001 | Dalacu | |
| 7,076,965 B2 | 7/2006 | Lasich | |
| 2002/0079095 A1* | 6/2002 | Davies et al. | 165/170 |
| 2005/0161074 A1 | 7/2005 | Garvison et al. | |
| 2006/0219291 A1* | 10/2006 | Hikosaka et al. | 136/251 |
| 2008/0105415 A1* | 5/2008 | Harich et al. | 165/149 |
| 2008/0302405 A1* | 12/2008 | Intrieri | 136/246 |

FOREIGN PATENT DOCUMENTS

| | | |
|---|---|---|
| EP | 0 981 167 A2 | 2/2000 |
| EP | 1 310 747 A1 | 5/2003 |
| FR | 2319585 | 2/1977 |
| FR | 2566183 | 12/1985 |
| FR | 2727790 | 6/1996 |
| FR | 2 911 997 | 8/2008 |
| FR | 2911997 | 8/2008 |
| GB | 2081861 A * | 2/1982 |

* cited by examiner

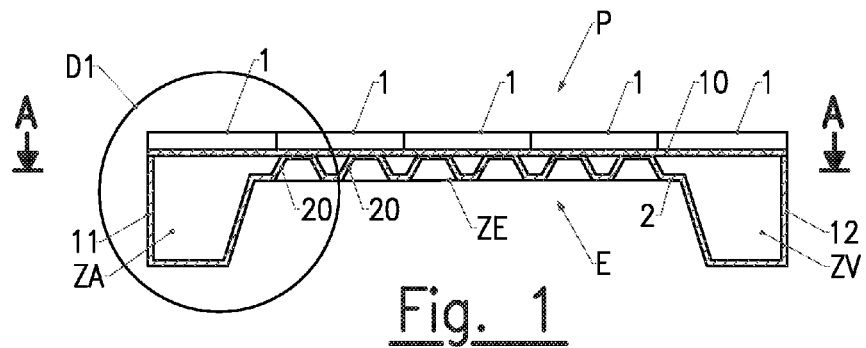
Fig. 1
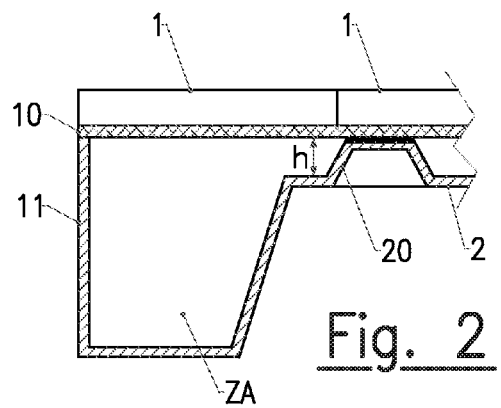
Fig. 2 (D1)
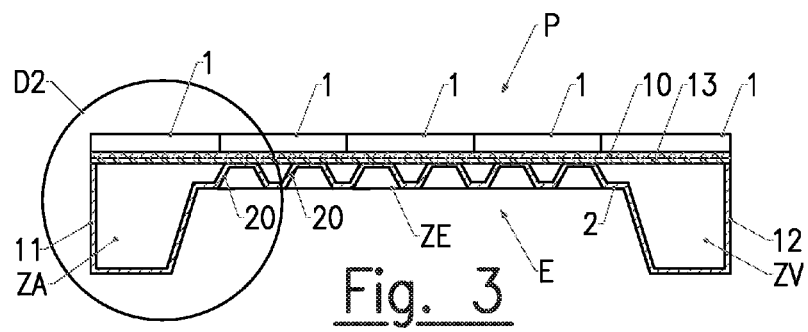
Fig. 3
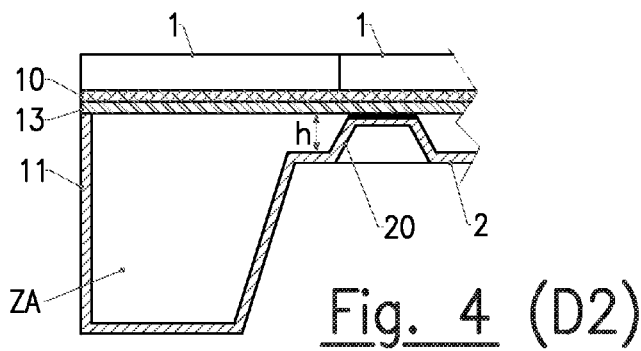
Fig. 4 (D2)

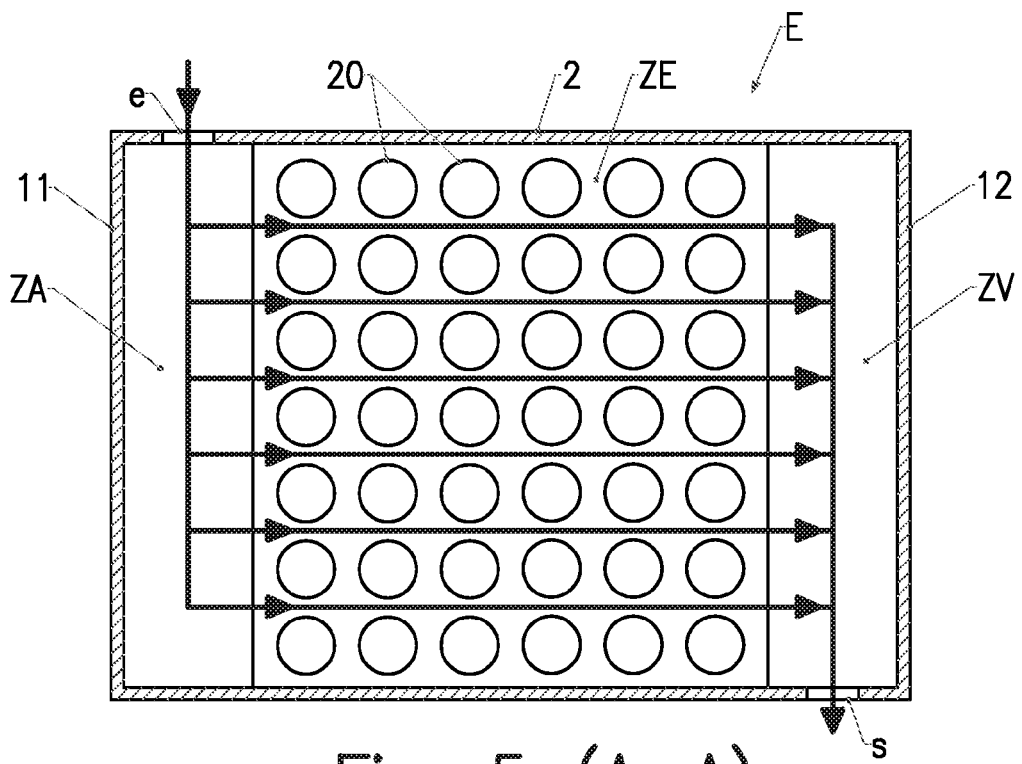
Fig. 5 (A-A)
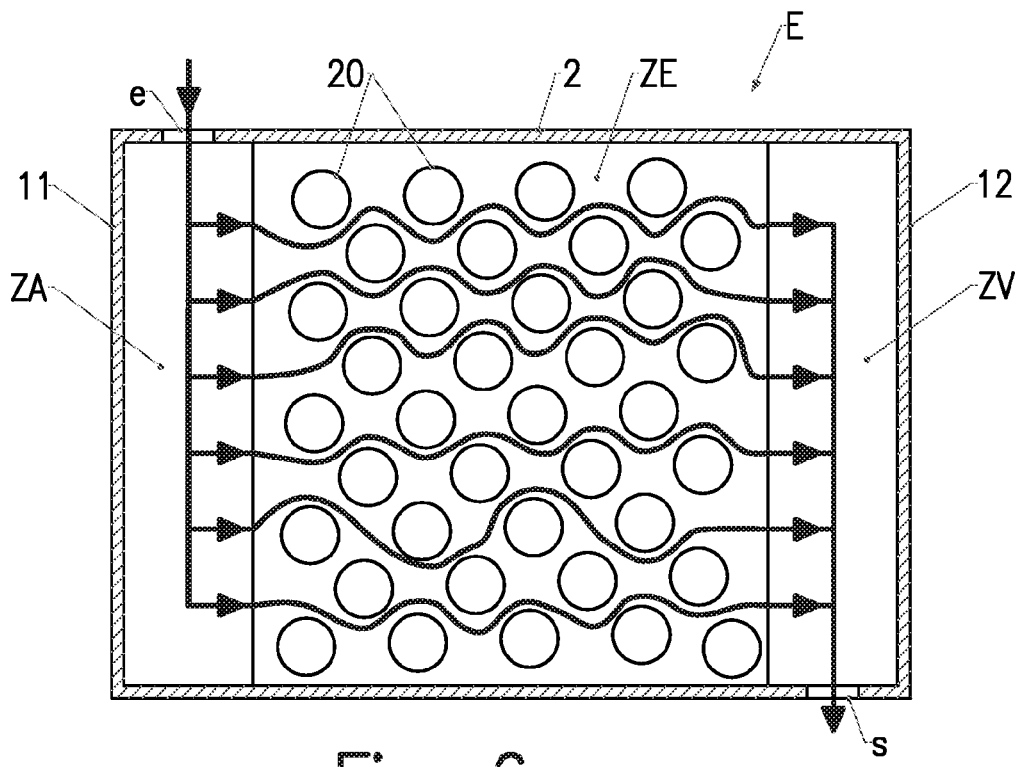
Fig. 6

HYBRID SOLAR PANEL

CROSS-REFERENCE TO RELATED APPLICATIONS

This application is a National Phase Application of PCT International Application No. PCT/FR2011/052718, entitled "HYBRID SOLAR PANEL", International Filing date Nov. 21, 2011, published on Nov. 15, 2015 as International Publication No. WO 2012/069750, which in turn claims priority from French Patent Application No. FR 1059597, filed Nov. 22, 2010, all of which are incorporated herein by reference in their entirety.

TECHNICAL FIELD OF THE INVENTION

An object of the invention is a hybrid solar panel. The invention also relates to a method for cooling the photovoltaic elements of a hybrid solar panel as well as a method of manufacturing such a solar panel.

It relates to the technical field of heat exchangers for thermal control of hybrid solar panels (capable of generating electrical energy and thermal energy), the aforementioned exchangers comprising means for disrupting the flow of the coolant fluid.

PRIOR ART

Photovoltaic solar panels enable generation of electrical energy from solar rays. They comprise a plurality of photovoltaic elements (typically cells or thin layers), which operate according to the principle of the photoelectric effect. Generally, multiple photovoltaic elements are connected interspaced on a photovoltaic solar panel, and multiple panels are assembled to form a solar plant. This plant generates electricity that can be consumed on site or to supply a distribution network.

Photovoltaic solar panels convert only a small part of the solar radiation into electricity (today less than 20%), the remainder being unused heat. This heat is detrimental to the electrical performance of solar panels, as a decrease in the efficiency of photovoltaic elements with temperature of approximately −0.45%/° C. can be observed. This is why it is doubly advantageous to cool the solar panels. Indeed, not only does the efficiency of photovoltaic elements increase, but the heat from the cooling can be used in more or less complex heating systems. We speak then of hybrid solar panels capable of generating electrical and thermal energy.

Generally, a heat exchanger is positioned opposed to the rear face of the photovoltaic elements as so to cool the latter. The following patents describe a certain number of heat exchangers for solar panels: FR 2,319,585 (LIEBARD); FR 2,566,183 (LUCCIONI); FR 2,727,790 (CYTHELIA); U.S. Pat. No. 4,361,717 (GILMORE); U.S. Pat. No. 4,184,543 (KLEINE); U.S. Pat. No. 7,076,965 (LASICH); DE 197.47.325 (SCHRENK) or DE 10.2004.002.900 (MASCHKE).

All these exchangers enable cooling of the photovoltaic elements in order to increase their performance. However, they have a number of drawbacks: their design can be relatively complex and makes the panels heavy. They do not enable uniformly cooling the photovoltaic elements. The heat is not extracted in an optimized manner. It is necessary to use much energy in order to circulate the refrigerant, etc.

Known more particularly, from the document FR 2,911,997 (DIEMUNSCH), is a hybrid solar panel in which the heat exchanger comprises a lower plate positioned under the photovoltaic elements and on which flows a coolant fluid, with a laminar flow pattern. Elements for disrupting the flow of the coolant fluid are positioned on the base plate so as to so as promote heat transfers. The disruption elements can be ribs oriented in the direction of flow, the cylindrical or spherical obstacles enabling the creation of three-dimensional Von Karman type vortexes, fins whose height is less than the thickness of the flow in order to create vortexes from edges of blades or impellers introduced into the thin volume of into fluid, perpendicularly to the flow.

These different disruption elements are all assembled on the base plate. It is therefore necessary to attach them by gluing, welding or screwing, steps that complicate the design and that are time consuming. Costs for manufacturing such a heat exchanger industrially, that is to say in large quantities, are therefore relatively high.

Given this state of affairs, the main objective of the invention is to simplify the design of heat exchangers for hybrid solar panels, so that they can be manufactured industrially, faster and at lower costs.

Among other objectives, to be achieved by the invention, can be cited: a uniformity of temperature in the photovoltaic elements, an optimum extraction of heat, robustness of the solar panel while reducing its weight.

DISCLOSURE OF THE INVENTION

The solution offered by the invention is a hybrid solar panel comprising:
photovoltaic elements comprising a front face and a rear face,
a heat exchanger positioned opposed to the rear face of the aforementioned photovoltaic elements,
a coolant fluid circulating in the aforementioned heat exchanger so as to cool the aforementioned photovoltaic elements,
the aforementioned exchanger comprising a heat transfer zone positioned under the aforementioned photovoltaic elements and wherein the aforementioned fluid flows, the aforementioned transfer zone comprising elements enabling disruption of the flow of the aforementioned fluid so as to facilitate thermal transfers in the transfer zone.

This panel is remarkable:
in that the lower plate is formed so to form integrated disruption elements extending over the entire thickness of the thin volume of the aforementioned coolant fluid flowing in the aforementioned transfer zone. It therefore includes, after manufacturing, these disruption elements, which greatly simplifies the manufacture of the exchanger,
and in that the upper end of the disruption elements is in contact with the rear face of the photovoltaic elements so that the aforementioned photovoltaic elements are mainly cooled at these contact points.

In an implementation variant, an upper exchange plate, advantageously based on aluminum, is attached to the rear face of the photovoltaic elements, the upper end of disruption elements being in contact with the aforementioned upper plate so that the temperature of the latter is homogenous without cold or hot spots.

Whatever the solution, the technical result is the same. Indeed, the thermal contact between the disruption elements and the rear face of the photovoltaic elements (or the upper exchange plate), provides an effective heat transfer to the lower plate which is not possible with the panel described in the document FR 2,911,997 cited above.

The lower plate can thus efficiently extract heat from the photovoltaic elements, which is evacuated by the coolant fluid. The latter thus recuperates not only the heat at the back of the photovoltaic elements, but also at the lower plate.

The disruption elements preferably form bumps at the upper face of the lower plate on which the coolant fluid flows and form recesses at the lower face of the aforementioned plate that is not in contact with the aforementioned fluid and that is opposed to the aforementioned upper face.

The lower plate is advantageously metallic and stamped so as to form the disruption elements.

Preferably, the heat exchanger is a monobloc piece, the lower plate being shaped so as to constitute not only the transfer zone, but also an inlet zone and a discharge zone for the coolant fluid.

The lower plate can be shaped so as to constitute not only the heat transfer zone, but also all or part of the substrate upon which the photovoltaic elements rest.

The heat exchanger preferentially comprises channels for circulating the coolant fluid, positioned on both sides of the transfer zone, the aforementioned channels having pressure drops providing a uniform distribution of the aforementioned fluid in the aforementioned transfer zone. The lower plate can be shaped so as to form these distribution channels.

In order to optimize the homogenization of the coolant fluid in the transfer zone, the depth of the flow channels is preferably greater than the thickness of the thin volume of the aforementioned fluid flowing in the aforementioned transfer zone. More generally, the pressure drops generated in the circulation channels are negligible compared to those induced in the transfer zone.

The rear face of the exchanger can be devoid of any thermal insulation means.

According to another feature of the invention, a long thin junction box is positioned on the rear face of the aforementioned panel, preferably against a rear edge of the aforementioned panel, and more generally without being opposed to the rear face of a photovoltaic element. This feature is technically independent of other features described above and in particular the design of the exchanger.

Another aspect of the invention relates to a method for cooling the photovoltaic elements of a hybrid solar panel, comprising:
  circulating a coolant fluid in a heat transfer zone positioned under the aforementioned photovoltaic element so as to cool them,
  disrupting the flow of the aforementioned fluid in the aforementioned transfer zone,
This method is remarkable in that the coolant fluid is disrupted by incorporating, in the transfer zone, disruption elements, obtained by the shaping of a lower exchange plate, the aforementioned elements extending over the entire thickness of the thin volume of the aforementioned fluid flowing in the aforementioned transfer zone.

Yet another aspect of the invention relates to a method of manufacturing a hybrid solar panel in which a heat exchanger is positioned under the photovoltaic elements of the aforementioned panel, the aforementioned method comprising:
  positioning a lower exchange plate under the aforementioned photovoltaic elements, and on which is designed to flow a coolant fluid, the aforementioned plate forming a heat transfer zone comprising elements enabling disruption of the flow of the aforementioned fluid,
  shaping the aforementioned lower plate so as to form integrated disruption elements adapted to extend over the entire thickness of the thin volume of the aforementioned coolant fluid flowing in the aforementioned transfer zone.

Preferably, a metal lower plate that is stamped to form the disruption elements is used.

DESCRIPTION OF FIGURES

Other features and advantages of the invention will become better apparent upon reading the description of a preferred implementation mode that will follow, with reference to the accompanying drawings, made by way of illustrative and non-limiting examples and in which:

FIG. 1 is a schematic sectional view of a hybrid solar panel in accordance with the invention, FIG. 2 is an enlarged view of the detail D1 of FIG. 1, FIG. 3 is a schematic sectional view of a hybrid solar panel in accordance with the invention, in an implementation variant, FIG. 4 is an enlarged view of the detail D2 of FIG. 3, FIG. 5 is a sectional view along A-A of the panel of FIG. 1, the disruption elements being arranged linearly, FIG. 6 shows the panel of FIG. 5 in an implementation variant, the disruption elements being arranged staggered.

IMPLEMENTATION MODES OF THE INVENTION

The solar panel object of the invention is a hybrid panel; that is to say it is able to generate electrical energy and thermal energy. It is designed to be used alone or in combination with other similar panels, so that the electrical and thermal energy it generates is usable by a home or a plant.

Referring to FIGS. 1 to 4, the solar photovoltaic panel P includes elements 1 comprising a front face and a rear face. The front face is left free so that it can receive solar radiation. The rear face is opposed to a heat exchanger E. The solar panel P comprises multiple photovoltaic elements 1 connected in series or in parallel. The latter can contain photovoltaic cells, photovoltaic thin films, etc. The type of photovoltaic elements adapted to be used being well known to the person of skill in the art, they will not be detailed here with more specificity.

In practice, the photovoltaic elements 1 rest on the exchanger E which acts as support. They can be attached directly on the latter, or be first attached to a rigid frame that can itself be attached to the aforementioned exchanger. In case of presence of a frame, it is not necessary, however, that there be attachment of the exchanger to this frame. In fact, it is sufficient that the latter be placed under the photovoltaic elements, without providing support function. In all cases, the exchanger E is positioned under the photovoltaic elements 1 so as not to obstruct the solar rays.

A coolant fluid, which is typically glycol water, circulates in the exchanger E in order to recuperate the heat from the photovoltaic elements 1. In order to electrically protect the photovoltaic elements 1 from the coolant fluid, a sealed electrical insulator 10 makes the interface with the rear face of the aforementioned elements. There is therefore no direct contact between the electrical elements of photovoltaic elements 1 and the coolant fluid. This insulator 10 can comprise a sheet (better known as the English term "back sheet") pre-glued to the photovoltaic elements 1, or electrically insulating adhesive (such as silicone gel for example). Within the meaning of the present invention, the "rear face" of the photovoltaic elements is understood to be electrically insulated by the electrically insulating seal 10 and/or the upper plate 13 described later. The rear face of photovoltaic elements 1 is thus electrically insulated.

In practice, the heat exchanger E comprises three main zones: an inlet zone ZA for the coolant fluid, a heat transfer zone ZE and a discharge zone ZV for the aforementioned fluid. The photovoltaic elements 1 are preferentially assembled over the transfer zone ZE but can be distributed over the inlet ZA and discharge ZV zones. The transfer zone ZE has for example a surface of between 0.5 m$^2$ and 4 m$^2$.

Figure 7:
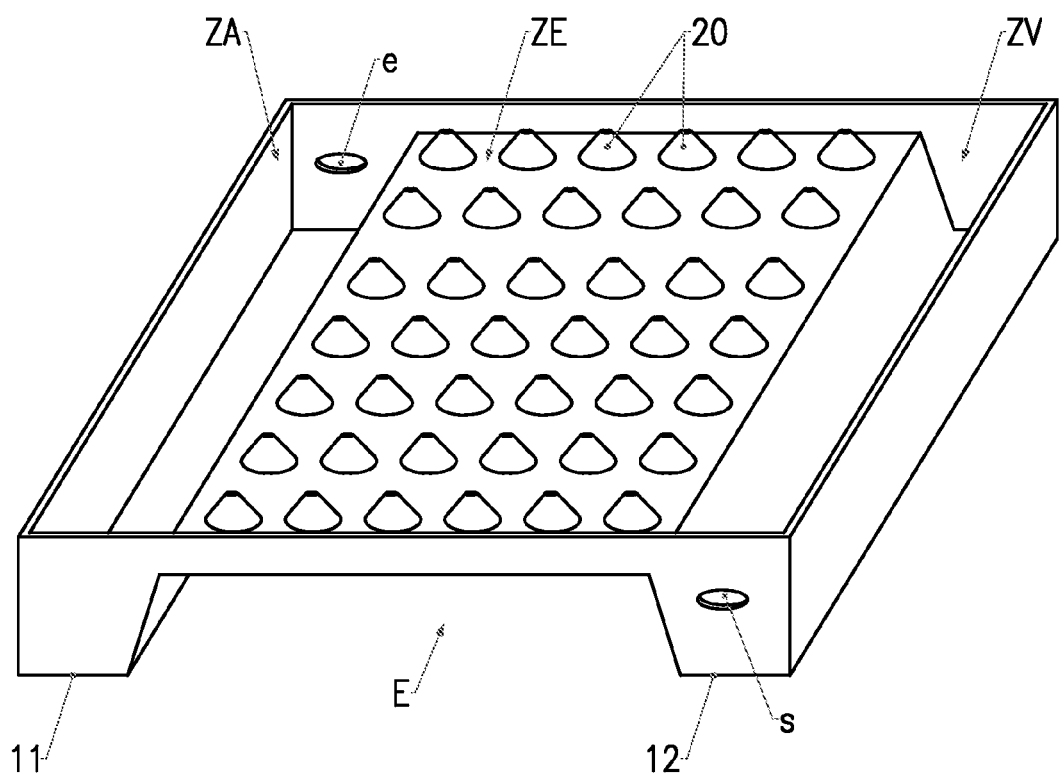
FIG. 7 shows, in perspective, a lower exchange plate in accordance with the invention.

As shown in FIG. 7, the heat exchanger E is preferably a monobloc part obtained by stamping of a metal plate, by molding or otherwise. The configuration of this monobloc part delimits not only the transfer zone ZE but also the inlet ZA and discharge ZV zones.

Referring to FIGS. 1-9, the inlet ZA and discharge ZV zones are formed by circulation channels 11, 12 positioned on each side of the transfer zone ZE. These channels 11, 12 have the shape of gutters communicating, by their longitudinal edges, with the transfer zone ZE. They are mutually parallel and are oriented perpendicularly to the direction of fluid flow in the heat transfer zone ZE. In FIGS. 5 to 6, the input e and the output s of the fluid in the heat exchanger E are primarily diagonally opposed but can be arranged symmetrically at the same level. The input e and the output s can be located in the bottom of the circulation channels 11, 12 or be made on the lateral walls of the latter. The channels 11, 12, can have a rectangular, square, trapezoidal, round or other section, and have negligible pressure drops compared to the pressure drops of the transfer zone ZE. In practice, the depth of the circulation channels 11, 12 is greater than the thickness of the thin volume of fluid flowing in the transfer zone ZE. This quasi absence of pressure drops on the sides of the exchanger E acts as a distributor. Indeed, the fluid first fully fills the inlet channel 11 before spreading uniformly in the transfer zone ZE. The fluid exits the latter, and flows into the outlet channel 12, without encountering obstacle. The occurrence of preferential paths for the coolant fluid are avoided, and hot spots are eliminated under the photovoltaic elements 1.

The heat transfer zone ZE is formed by a lower exchange plate 2 positioned under the photovoltaic elements 1 and on which the coolant fluid flows. In accordance with the invention, the lower plate 2 is shaped so as to form disruption elements 20. The plate 2 thus includes, after manufacturing, these disruption elements 20 which are made of the same material as the aforementioned plate. They have a double function:
- to disrupt the flow of coolant fluid so as to promote the heat transfer in the transfer zone ZE,
- to increase the heat transfer surface and thus participate in the heat transfer.

In practice, the disruption elements 20 can have the form of ribs, nipples, semi-sphere, cylindrical or polygonal tubes, pyramids, etc. Along the surface of the transfer zone ZE, the number of disruption elements 20 can vary from some dozen to several hundred. For example one or several hundred disruption elements 20 per m$^2$ exchange surface can be provided. For example 300 disruption elements per m$^2$ can be provided. They can be evenly distributed, and more specifically linearly, forming parallel flow paths, as shown in FIG. 5. In this case, the flow of the coolant fluid is globally parallel, but locally disrupted at the elements 20. In an alternative implementation mode shown in FIG. 6, the disruption elements 20 can be distributed irregularly, and particular staggered. In this case, the flow of coolant fluid is disrupted without necessarily being parallel.

The disruption elements 20 extend over the entire thickness of the thin volume of fluid flowing in the transfer zone ZE. Referring more particularly to FIGS. 2 and 4, the height "h" of the disruption elements 20 corresponds to the thickness of the thin volume of fluid flowing in the transfer zone ZE. Thus, there is no thin volume of fluid that can pass over disruption elements 20. In practice, the thickness of the thin volume of fluid in the transfer zone ZE (and height "h" of the disruption elements 20) is a few millimeters.

A plate 2 is preferably made of aluminum or aluminum alloys, in order to obtain a good compromise between weight/price/thermal conductivity. However, other metals (copper, zinc, iron, . . . ) or other heat conductor materials (carbon, thermoplastics such as polyacetylene, polyaniline, polypyrrole; polymers filled with metal powders or flakes; . . . ) and suitable to a person of skill in the art can be used. In practice, a metal plate 2 that is pressed to form the disruption elements 20 is used. Referring to FIGS. 1 to 4, it clearly appears that the disruption elements 20 form bumps at the upper face of the plate 2 on which the coolant fluid flows and form recesses at the lower face of the aforementioned plate that is not in contact with the aforementioned fluid and that is opposed to the aforementioned upper face. These recesses increase the heat transfer surface between the plate 2 and the air circulating under the transfer zone ZE.

Referring to the implementation mode of FIGS. 1 and 2, the upper end of the disruption elements 20 is directly in contact with the rear face of the photovoltaic elements 1. The upper end of the disruption elements 20 is for example glued to the insulator 10. The photovoltaic elements 1 are mainly cooled at these contact points. The upper end of the disruption elements 20 is shaped so as to provide a surface contact with the rear face of the photovoltaic elements 1. This contact surface is advantageously between 1 mm$^2$ and 10 cm$^2$, preferably approximately 3 mm$^2$, more preferably approximately 4.5 mm$^2$. This surface contact, between the upper end of disruption elements and the rear face of the photovoltaic element 1, provides an effective heat transfer to the lower plate 2. The coolant fluid thus recuperates the heat not only at the back of the photovoltaic elements 1, but also at the lower plate 2, which greatly increases the heat transfer and optimizes the cooling of the aforementioned photovoltaic elements.

In an implementation variant shown in FIGS. 3 and 4, an upper exchange plate 13 is attached to the rear face of the photovoltaic elements 1. As for the lower plate 2, an upper plate 13 is preferably made of aluminum or aluminum alloys. Other heat conductive materials described above and type suitable to the person of skill in the art can, however, be used.

The upper end of the disruption elements 20 is shaped so as to provide a surface contact with the upper plate 13. This contact surface is advantageously between 1 mm$^2$ and 10 cm$^2$, preferably approximately 3 mm$^2$, more preferably approximately 4.5 mm$^2$. The upper plate 13 is for example glued or welded to the ends of the disruption elements 20 and/or on the edges of the exchanger E.

Multiple solutions enable assembly of the upper plate 13 and the photovoltaic elements 1. The plate 13 can for example be glued on a pre-glued insulating sheet on the rear face of the photovoltaic elements 1. The plate 13 can also be attached on the rear face of the photovoltaic elements 1 using an electrically insulating adhesive (for example, silicone gel). It is also possible to coat the plate 13 with an insulation film and to create a vacuum between the aforementioned plate and a glass/plastic stiffening plate, the photovoltaic elements being placed between the two aforementioned plates. The patch plate 13 ends up pressed to the glass/plastic plate by vacuum suction, the photovoltaic elements being sandwiched. In any event, regardless of the attachment technique used, the plate 13 provides a sealing function for the coolant fluid.

The lower plate 2 tends to be colder than the upper plate 13, because the disruption elements 20 enable to cool it well. The upper end of the disruption elements 20 provides a good thermal contact with the upper plate 13. This surface contact, between the upper end of the disruption elements 20 and the upper plate 13, provides efficient transmission of heat to the lower plate 2. The coolant fluid thus recuperates heat not only at the upper plate 13, but also at the lower plate 2, which greatly increases the heat transfer and optimizes the cooling of the aforementioned photovoltaic elements. Because of its good thermal conductivity, the temperature of the upper plate 13 is homogenized rapidly, the aforementioned plate being entirely cooled, without retaining cold or hot spots (while in the example of FIGS. 1 and 2, the cooling was occurring locally at the upper ends of the disruption elements 20). The main advantage, of obtaining a uniform temperature on the upper plate 13, is that the photovoltaic elements 1 will be cooled uniformly, thus no hot spot. The panel efficiency is thus increased, being recalled that the photovoltaic elements 1 set their electricity generation on the weakest element, that is to say, the hottest.

In accordance with the invention, the plate 2 is shaped so that it directly integrates the disruption elements 20. The plate 2 can also be shaped so as to constitute all or part of the substrate upon which the photovoltaic elements 1 rest. Its bulkiness and weight being thus reduced, the exchanger E is nevertheless structurally superior with regard to the panel than exchangers known in the prior art. The plate 2 can be also be shaped to form the distribution channels 11, 12 (FIG. 7). In this case, the exchanger E is monobloc, formed from a single piece defining the inlet zone ZA of the coolant fluid, the heat transfer zone ZE with integrated disruption elements and the discharge zone ZV of the aforementioned fluid. One can, however, foresee attaching other pieces to the plate 2 in order to strengthen it. But in all cases, the number of constituent parts of the exchanger E is reduced compared to the exchangers known from the prior art.

Figure 10A:
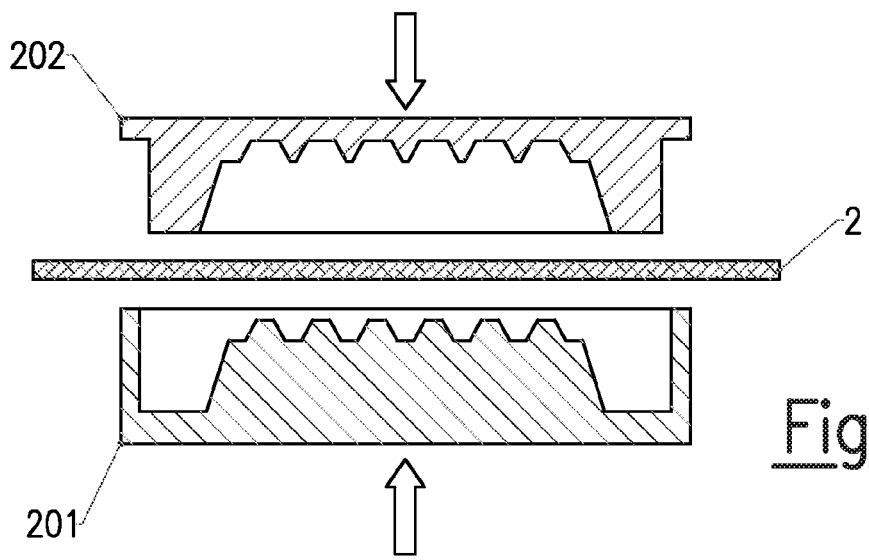
Figure 10B:
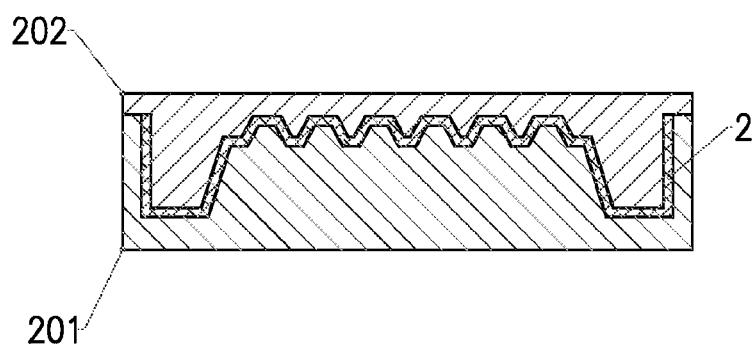
Figure 10C:
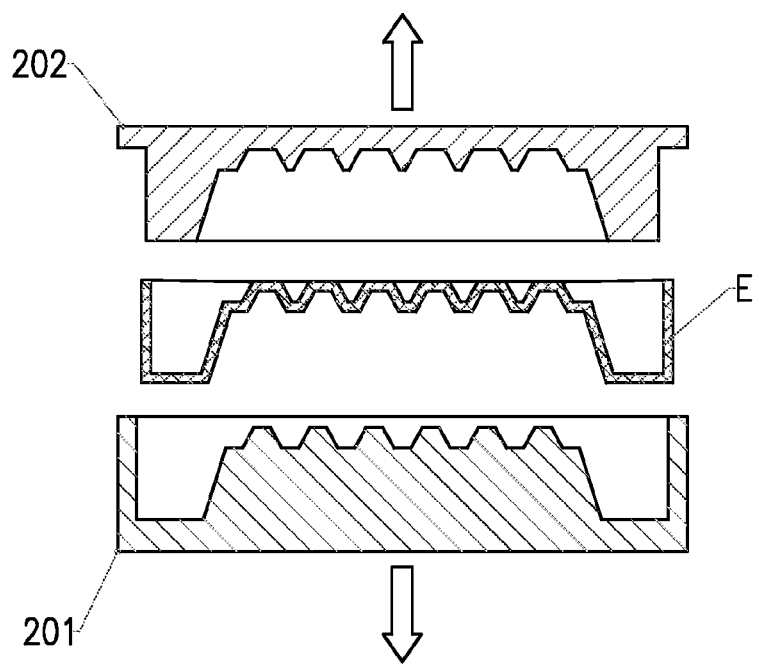

FIGS. 10a to 10c schematically show the different steps of manufacturing a monobloc exchanger incorporating not only the disruption elements but also the lateral circulation channels. The illustrated technique is embossing (or die-stamping). A metal plate 2 is positioned opposing a die 201 and a punch 202 (FIG. 10a). The die 201 and the punch 202 have complementary indentations whose geometry corresponds to the part to be made. Upon penetrating into the matrix 201, the punch 202 will deform the plate 2 in order to shape it to the desired geometry (FIG. 10b). It then suffices to separate the punch 202 from the matrix 201 so as to obtain the exchanger E. The manufacturing method being very simple and very rapid, this type of exchanger can be easily commercialized.

It would also be possible to obtain a monobloc exchanger with other manufacturing techniques such as casting, in the case where the material used is of the type cast, filled polymers or thermoplastics.

Photovoltaic solar panels generally use junction boxes to house the bypass diodes. These boxes are generally rectangular in shape and are attached to the rear face of the panel. Given the bulkiness of these boxes, the hybrid panels must fashion, by their geometry, the aforementioned boxes, by providing a housing in the exchanger. At this junction box housing, the heat transfer is disrupted, or diminished, so that the photovoltaic elements located just above are not optimally cooled. This affects the output of the panel given that it is still the hottest photovoltaic element, thus the weakest, to which the panel assembly conforms.

Figure 8:
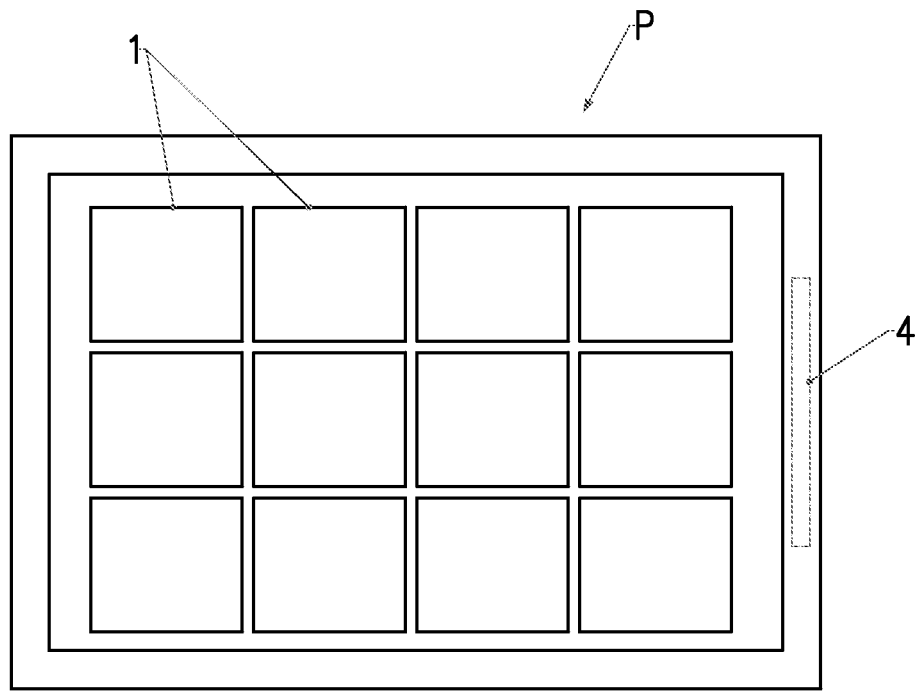
FIG. 8 is a top view of a solar panel fitted with a junction box.
Figure 9:
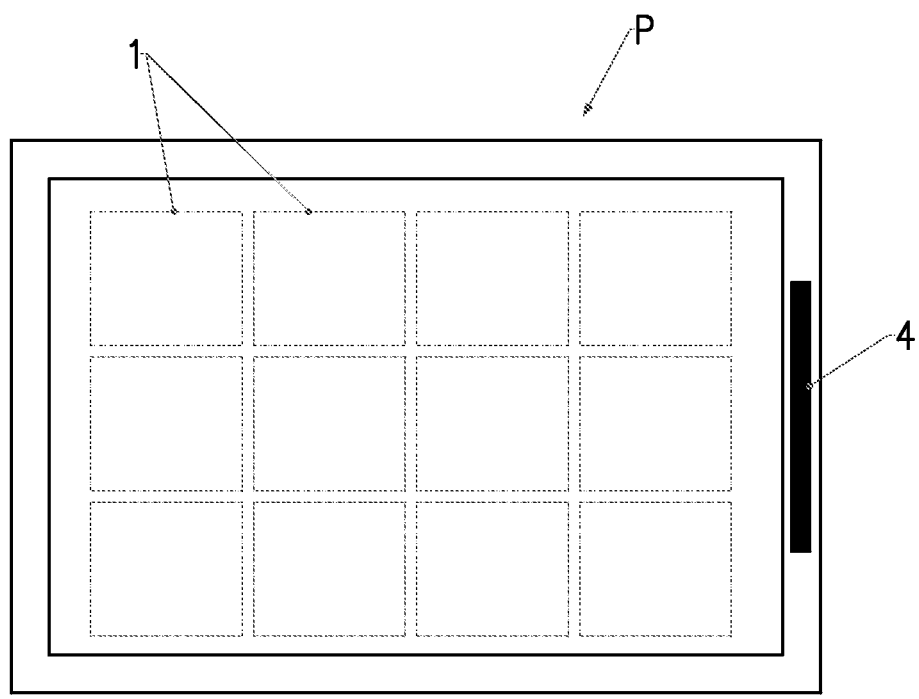
FIG. 9 is a bottom view of the solar panel of FIG. 6, FIGS. 10a to 10c schematically show different steps of manufacturing of a monobloc heat exchanger in accordance with the invention.

To resolve this problem, long and thin junction boxes are used, for example, TYCO® brand decentralized boxes. In practice, the box used has a length of approximately 130 mm, a width of approximately 12 mm and a height of approximately 12 mm. Referring to FIGS. 8 and 9, this junction box 4 is positioned on the rear face of the panel P, preferably against a rear edge of the aforementioned panel, and more generally without being opposed to the rear face of a photovoltaic element 1. The thinness of such a box enables it to be completely "above" the first row of photovoltaic elements 1, the latter being thus all evenly cooled.

The invention claimed is:

1. A hybrid solar panel comprising:
    photovoltaic elements comprising a front face and a rear face,
    a heat exchanger positioned opposed to the rear face of the photovoltaic elements,
    a coolant fluid circulating in the exchanger cooling the photovoltaic elements,
    the heat exchanger comprising a heat transfer zone positioned under the photovoltaic elements and wherein the fluid flows, the transfer zone comprising elements disrupting the flow of the fluid so as to facilitate heat transfer in the transfer zone,
    wherein the transfer zone is formed by a lower exchange plate positioned under the photovoltaic elements and made of a heat conductive material, the lower exchange plate having an upper surface on which the coolant fluid flows with an array of integrated disruption elements extending over an entire thickness of a thin volume of the coolant fluid flowing in the transfer zone, the disruption elements being made of a same heat conductive material as the lower exchange plate,
    wherein the lower exchange plate is shaped to form channels for circulating fluid on opposite sides of the transfer zone, the channels having a depth greater than the thickness of the thin volume of coolant fluid flowing in the transfer zone so that the channels have pressure drops lower than a pressure drop in the transfer zone to provide uniform fluid distribution of the fluid in the transfer zone,
    and an upper exchange plate attached to the rear face of the photovoltaic elements, an upper end of the disruption elements being in surface contact with the upper exchange plate,
    a heat transfer being performed between the upper exchange plate and the lower exchange plate through the disruption elements, so that the coolant fluid collects heat from the photovoltaic elements not only at the rear face of the photovoltaic elements, but also at the lower exchange plate, making the temperature of the upper exchange plate homogenous without cold or hot spots,
    the upper end of the disruption elements being attached to the upper exchange plate,
    the disruption elements being distributed in discontinuous staggered rows extending along a length and width of the transfer zone and selected from the group consisting of nipples, semi-spheres, cylindrical tubes, polygonal tubes and pyramids.

2. A hybrid solar panel according to claim 1, wherein the disruption elements form bumps at an upper face of the lower exchange plate on which the coolant fluid flows and form hollows at an underside of the lower exchange plate, which is not in contact with the fluid end which is opposite to the upper face.

3. A hybrid solar panel according to claim 1, wherein the lower exchange plate is metallic and stamped so as to form the disruption elements.

4. A hybrid solar panel according to claim 1, wherein the heat exchanger is a monobloc piece, the lower exchange plate being shaped so as to form not only the transfer zone, but also an inlet zone and a discharge zone for the coolant fluid.

5. A hybrid solar panel according to claim 1, wherein the heat exchanger has a rear face which is devoid of heat insulating means.

6. A hybrid solar panel according to claim 1, wherein a long thin junction box is positioned on the rear face of the panel, without being opposed to the rear face of a photovoltaic element.

7. A hybrid solar panel according to claim 1, comprising several hundred disruption elements per m$^2$ of heat exchange surface, the disruption elements being irregularly distributed.

\* \* \* \* \*